(12) United States Patent
Blossfeld

(10) Patent No.: US 6,320,430 B1
(45) Date of Patent: Nov. 20, 2001

(54) METHOD AND APPARATUS FOR PROCESSING A MEASUREMENT SIGNAL

(75) Inventor: Lothar Blossfeld, Breitnau (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/675,794

(22) Filed: Sep. 29, 2000

(30) Foreign Application Priority Data

Sep. 29, 1999 (DE) ................................. 199 46 626

(51) Int. Cl.⁷ ............................................. G11G 27/02
(52) U.S. Cl. ........................................ 327/91; 327/165
(58) Field of Search ................................ 327/91, 94, 165, 327/334

(56) References Cited

U.S. PATENT DOCUMENTS

| | | | |
|---|---|---|---|
| 5,469,166 | * 11/1995 | Regev | 342/14 |
| 5,610,950 | * 3/1997 | Duch | 327/551 |
| 5,847,558 | * 12/1998 | McGuire et al. | 327/2 |
| 6,049,297 | * 4/2000 | Ducharme et al. | 327/2 |

FOREIGN PATENT DOCUMENTS

| | | |
|---|---|---|
| 39 05 735 A1 | 8/1990 | (DE) . |
| 43 36 813 A1 | 5/1995 | (DE) . |
| 199 13 753 A1 | 10/1999 | (DE) . |

OTHER PUBLICATIONS

PROFOS, P., "Handbuch der industriellen Messtechnik," Essen: Vulkan Verlag Dr. W. Classen Nachf. GmbH & Co. KG, 1978, pp. 163–168, 175–186.

GLASMACHERS, Gisbert, "Breitbandverstärker–Offset im Griff.," Elektronik, Jan. 1998, H. 1, pp. 70–73.

* cited by examiner

*Primary Examiner*—Toan Tran
(74) *Attorney, Agent, or Firm*—Samuels, Gauthier & Stevens, LLP

(57) ABSTRACT

A system for processing a signal s(t) from a sensor to recover sensed signal information within the bandwidth of the summation signal, wherein the signal s(t) includes a sensed signal m(t) and an offset signal having a first frequency f1. The system comprises: a sampling device for sampling the signal s(t) at a second frequency f2 that is a multiple of the first frequency f1, to create a sequence of sampled values; and an averaging device for averaging the sequence of sampled values to provide a sequence of averaged sampled values indicative of the sensed signal m(t).

9 Claims, 4 Drawing Sheets

METHOD AND APPARATUS FOR PROCESSING A MEASUREMENT SIGNAL

BACKGROUND OF THE INVENTION

The present invention relates to a technique for processing a measurement signal.

Measurement devices, such as sensors, bridge circuits, or the like, have a disadvantage that they often superpose a first offset signal on the measurement signal of interest to the user. This offset signal is due to the mechanical sensitivity of the measurement device, inaccuracies in the manufacturing technique of the measurement devices, and/or the electronics. The magnitude of this offset signal is often unknown to the user and varies in time.

Some measurement devices, such as Hall sensors or Wheatstone bridges can be driven in such a way that the offset signal is alternately added to and subtracted from the measurement signal. Therefore, the offset signal is superposed on the measurement signal as an AC signal, preferably a square-wave signal. Driving the sensors or bridge circuits in this way is often referred to as "chopping". The frequency that the offset signal changes sign is called the "chopper frequency".

The chopper frequency is typically selected to have a much higher value than the maximum frequency of the measurement signal, so the high frequency offset signal can be separated from the measurement signal by a low-pass filter to obtain an offset-free measurement signal.

A disadvantage of this technique is the complication associated with the circuitry involved in filtering the signal, and the fact that filtering usually creates a new offset. Therefore, there is a need for a system and method for obtaining the measurement signal without the need for filtering.

SUMMARY OF THE INVENTION

Briefly, according to the present invention, a summation signal delivered by a measurement device, for example a Hall sensor or a Wheatstone bridge, and composed of a measurement signal and an offset signal with a first frequency (chopper frequency), is sampled at the rate of a second frequency so as to provide sample values, the second frequency being a multiple of the first frequency. To create measurement values from the measurement signal, the average of at least two sample values is then formed. These sample values are formed by sampling the summation signal at the interval of a half period of the first frequency or at the interval of an odd multiple of half the period of the first frequency. In forming the average, one always uses at least one sample value for which the value of the offset is added to the measurement value and always at least one sample value for which the value of the offset is subtracted from the measurement value. The offset is thus eliminated by forming an average.

Assuming that the measurement signal changes slowly compared to the first frequency of the offset signal, forming the average of two sample values at an interval of half the period of the offset signal would have no effect on the measurement value. The time delay of the measurement values caused by forming the average, or the time delay of a measurement signal processed and formed from the sample values, relative to the original measurement signal, can often be tolerated in actual practice.

Sampling the summation signal at the rate of the second frequency, which is a multiple of the first frequency, and creating the measurement values by forming averages also at the rate of the second frequency, improves the time resolution of the measurement signal. This is especially necessary for applications in which the zero passage of the measurement signal is to be evaluated.

In one embodiment, the summation signal that includes the measurement signal and the offset signal is amplified before being sampled. This amplification is often necessary if the amplitude of the first summation signal (i.e., the output signal of the measurement device) is too small for sampling and forming an average. Amplification of the first summation signal results in a second summation signal, which is then sampled, and the average of at least two sample values is then formed.

Problems may arise when using amplifiers that add a second offset to their input signal, in the present case the summation signal includes the measurement signal and the first offset signal.

This can be dealt with by changing the sign of the input signal of the amplifier at periodic intervals, or changing the phase of the input signal by 180 degrees, at the rate of a third frequency. This causes the second offset of the amplifier to be added to the negative input signal during intervals in which the sign of the input signal is changed, and to be added to the positive input signal during intervals in which the sign of the input signal is retained.

The sign change of the input signal at periodic intervals at the rate of the third frequency is reversed by changing the sign of the output signal at periodic intervals at the rate of this same frequency, such that the sign of the output signal is changed in phase with the sign change of the input signal. An output signal is thus obtained that corresponds to the input signal amplified by the amplification factor of the amplifier, and to which the second offset of the amplifier has been superposed as a square-wave signal of the third frequency. The method technique is referred to as chopping the amplifier with the third frequency.

The third frequency of the amplifier offset signal preferably corresponds to the first frequency of the offset signal of the measurement circuit or is an even multiple of this first frequency. This ensures that during the subsequent sampling and formation of an average, the value of the second offset of the amplifier is also eliminated.

If the chopper frequency of the amplifier (the third frequency) is identical to the chopper frequency of the measurement device (the first frequency), the signal present at the output of the amplifier corresponds to the amplified measurement signal, on which a total offset signal of the first frequency is superposed. The amplitude of the total offset signal includes the amplified first offset signal of the measurement circuit and the second offset signal of the amplifier. This total offset signal is eliminated by forming an average following the sampling.

The amplification of the amplifier is preferably regulated according to the amplitude of the input signal, so that the amplitude of the amplifier output signal remains constant, and thus essentially independent of the amplitude of the input signal.

In one embodiment, a system according to the present invention includes a sampling device for sampling an input signal, which depends on the summation signal, at the rate of a second frequency to produce a sequence of sample values. The sequence of sample values are input to a device for forming an average of at least two sample values.

The device for forming an average preferably has a memory device for storing sample values, and an adder for adding at least two memory values (i.e., past values) or for adding a memory value (i.e., a past value) and a sample value present at the input of the device.

The number of memory cells of the memory device preferably corresponds to the number of sample values obtained within half a period of the first frequency of the first offset signal.

In another design of the invention, the memory cells store the sample values of an entire period of the offset signal. To form the average, the values of two memory cells are here always added, these values having been obtained within a half period of the offset signal.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
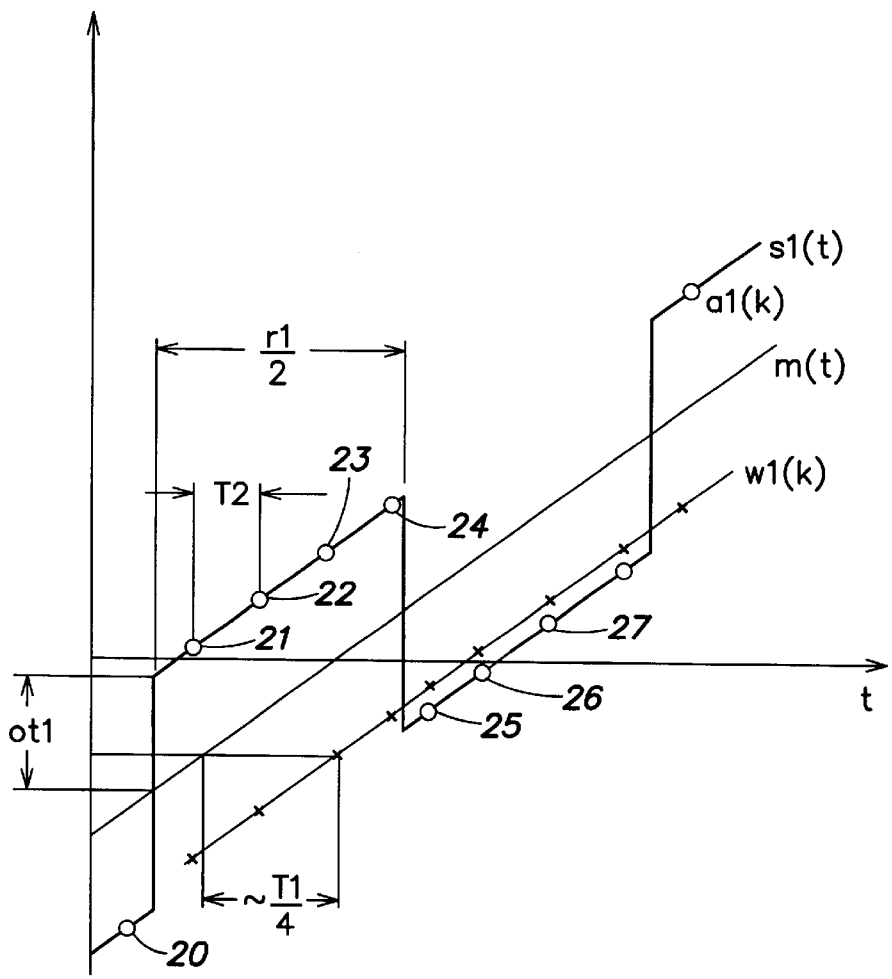
FIG. 1 is a plot of a measurement signal, a summation signal and a sequence of sampled measurement values as a function of time.

FIG. 1 is a plot of a measurement signal m(t), a summation signal s1(t) and a sequence of sampled measurement values w1(k) as a function of time. Measurement devices, such as sensors, Wheatstone bridges, or the like, which are used to measure such signals, frequently have the disadvantage that they superpose a first offset signal on the measurement signal m(t) of interest to the user. The offset signal is often caused by the mechanical sensitivity of the measurement circuit, inaccuracies in the manufacturing technique of the measurement equipment, and/or the electronics. Some sensors (e.g., Hall sensors or Wheatstone bridges) used for measurement purposes can be driven such that essentially constant first offset signals are alternately added to and subtracted from the measurement signal m(t) at a first frequency f1. In the case of Hall sensors, for example, the measurement equipment can be driven in this way by feeding current to the sensor alternately at different inputs.

Referring to FIG. 1, the output signal of a measurement device driven in this way is the first summation signal s1(t), which is the sum of the measurement signal m(t) and the square-wave offset signal that has a signal amplitude ot1 and a frequency equal to a first frequency value f1.

The first frequency f1 may be referred to as a chopper frequency of the measurement device, had has a frequency value that is greater than the maximum frequency of the measurement signal m(t). Ideally, the highest frequency within the bandwidth of the measurement signal m(t) and the first frequency f1 of the offset signal differ by a factor of ten or more. Referring still to FIG. 1, T1 designates the period of the offset signal, where T1=1/f1.

According to an aspect of the present invention, the first summation signal s1(t) is sampled at regular intervals T2=1/f2, where the sampling frequency f2 is preferably an integer multiple of the first frequency value f1. As shown in FIG. 1, the first frequency f1 and the second frequency f2 differ by a factor of 8 (i.e., f2=8*f1) so the first summation signal s1(t) is sampled eight times during one period T1 of the offset signal to provide eight sampled signal values 20–27 (FIG. 1). The sequence of these sample values is designated as a1(k), where a1(k)=s1(k·T2)and k is an integer.

To eliminate the first offset ot1 from the sequence of sampled values a1(k), the average of at least two sample values a1(k) is formed, wherein the sample values were obtained during a half period T1/2 or an odd multiple of the half period T1/2 of the offset signal. For example, referring still to FIG. 1, w1(k) represents a sequence of averages that were obtained by averaging two sample values from the sequence a1(k) at an interval of a half period T1/2. The sequence w1(k) can be expressed as w1(k)=0.5[a1(k)+a1(k−T1/(2·T2))], which can be rewritten as w1(k)=0.5[a1(k)+a1(k−n)], where n is the number of sample values created during the half period T1/2 of the first offset signal.

The error that the averaging step imposes on the actual measurement value of the measurement signal m(t) can be neglected, assuming that the minimum period of the measurement signal m(t) is much longer than the half period T1/2, which specifies the time spacing of the sample values a1(k), a1(k−n) to form the average, and also assuming that the slope of the measurement signal m(t) can be taken as approximately constant during the interval T1/2.

The step of forming an average causes the sequence of the measurement values w1(k) to be time shifted by about T1/4 relative to the measurement signal m(t). This constant time shift can be taken into account during the subsequent analysis of the measurement values, and consequently is non-critical for most applications.

The greater the sampling frequency f2, the more measurement values w1(k) will be generated per unit time by the sampling process and by the formation of an average, and the greater the time resolution that can be achieved by the inventive method. For many applications, the moment of the zero passage of the measurement signal m(t) or of the sequence of measurement values w1(k)—from which one can conclude to the measurement signal m(t) by taking into account the time shift due to the formation of an average—is of special interest. The moment of the zero passage is here delimited by the two measurement values of the measurement value sequence w1(k), between which a sign change has occurred. The maximum time difference here is 1/T2 and increases with increasing sampling frequency f2.

Figure 2:
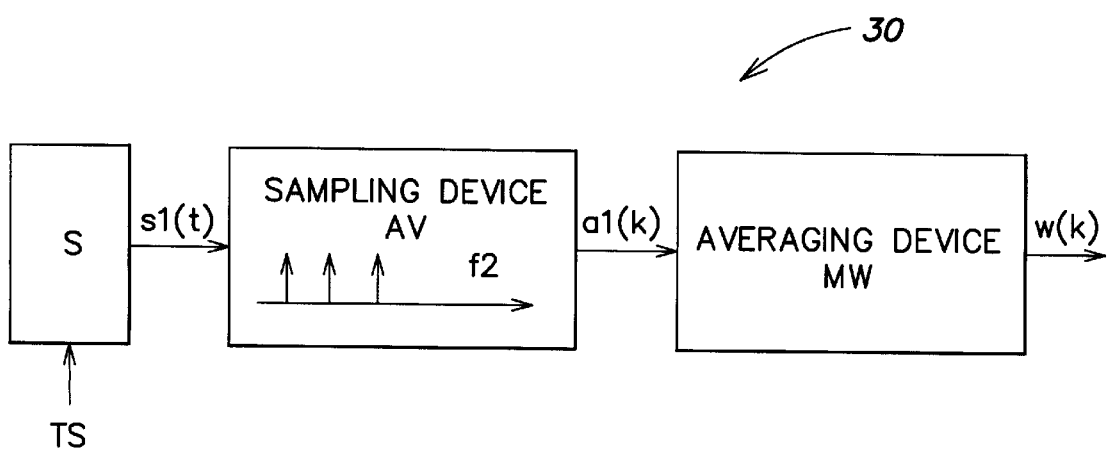
FIG. 2 is a functional block diagram illustration of a system for processing a measurement signal according to the present invention.

FIG. 2 is a functional block diagram illustration of a system for processing the measurement signal m(t). The system 30 includes a measurement device S that provides the first summation signal s1(t). As set forth above, the first summation signal s1(t) includes the superposition of the measurement signal m(t) and of an—at least approximately—square-wave offset signal of a first frequency value f1 and an amplitude value ot1. To superimpose the AC offset signal on the measurement signal m(t), the sensor S receives a clock pulse signal TS operating at first frequency f1, by which the measurement circuit S is "chopped".

The first summation signal s1(t) is input to a sampling device AV, which samples the signal at intervals of the period T2=1/f2 and outputs sampled values a1(k) at a cycle time T2 given by the sampling process. The sequence of sampled values a1(k) is input to an averaging device MW that forms the average of two sampled values a1(k), a1(k−n) obtained by sampling during a half period T1/2 of the offset signal or during an odd multiple of the half period T1/2 of the offset signal.

Figure 3:
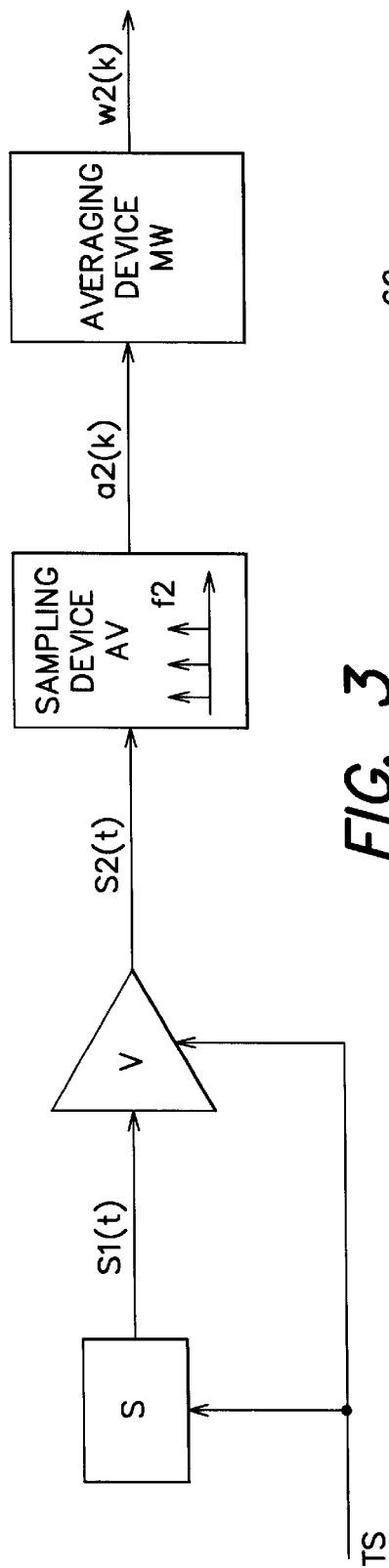
FIG. 3 is a functional block diagram illustration of an alternative embodiment system for processing a measurement signal that includes an amplifier.

FIG. 3 is a functional block diagram illustration of an alternative embodiment system for processing a measurement signal that includes an amplifier V. Since the amplitude of the summation signal s1(t) often is too small for the signal to be properly sampled, this system includes an amplifier V that receives the summation signal s1(t) and provides a second summation signal s2(t). The second summation signal S2(t) is input to the sampling device AV with the cycle period T2 to provide a sequence of sampled values a2(k). The sequence of sampled values a2(k) is input to the averaging device MW to generate a sequence of values w2(k) formed by averaging of two sample values a2(k), a2(k−n).

Figure 4:
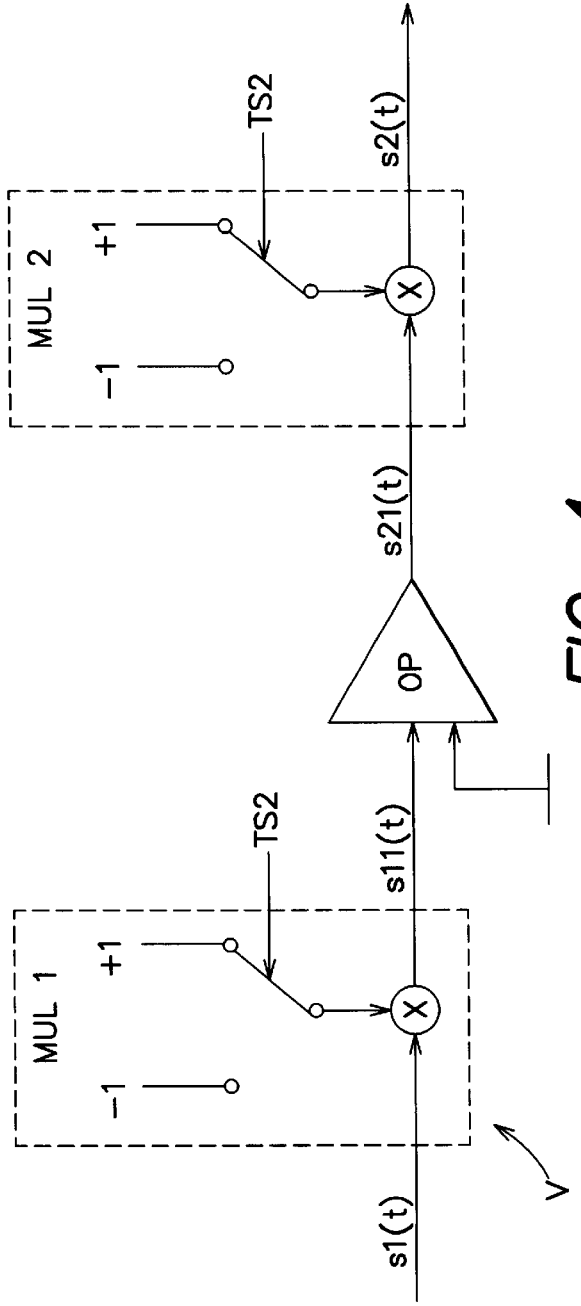
FIG. 4 is a schematic illustration of an amplifier suitable for the amplifier of FIG. 3.

A disadvantage of the embodiment illustrated in FIG. 3 is that the amplifier V may add an undesirable second offset to the summation signal s1(t). To avoid introducing this second offset, the amplifier V may be configured as the amplifier circuit 60 illustrated in FIG. 4.

The amplifier circuit 60 includes an amplifying element OP (e.g., op-amp), which amplifies an inputted signal s11(t) by a factor v and undesirably adds a second offset ot2 to the amplified signal. To remove the second offset, a first multiplication circuit MUL1 receives the input signal s1(t) and is multiplied by either the factor "+1" or "−1" as determined by a clock pulse signal TS2. This shifts the phase of the signal by 180 degrees, according to the specification of the clock pulse signal TS2. The phase shift of the input signal s1(t) is reversed by a second multiplication circuit MUL2, which is connected in series after the amplification element OP. The amplification element OP provides an output signal s21(t) that is multiplied by the factor "+1" or "−1" according to the specification of the clock pulse signal TS2. The multiplication circuits MUL1, MUL2 have a switch, which can be switched over in the cycle of the clock pulse signal TS2. This switch alternately applies the value "+1" or "−1". The switch is switched over and the phase of the input signal s1(t) and of the output signal s21(t) is shifted, preferably at the rate of the first frequency f1 or at the rate of an even multiple of the first frequency.

Figure 5A:
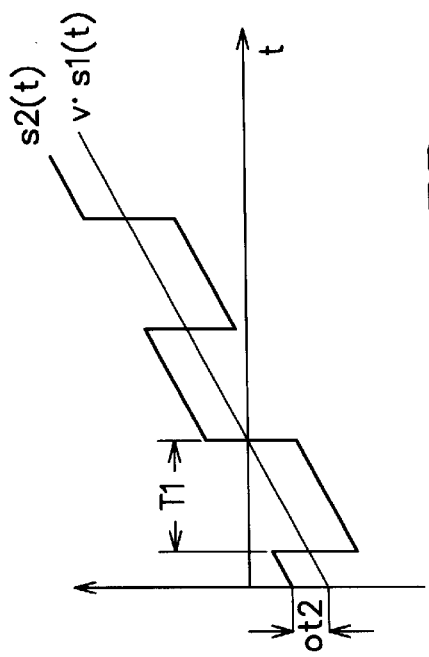
FIGS. 5A–5C are plots of the amplifier input and output signals as a function of time.
Figure 5B:
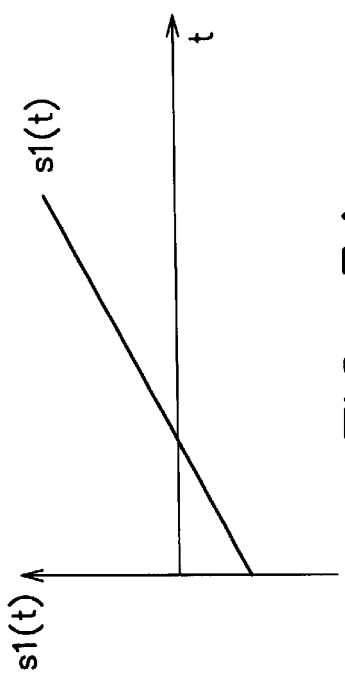
Figure 5C:
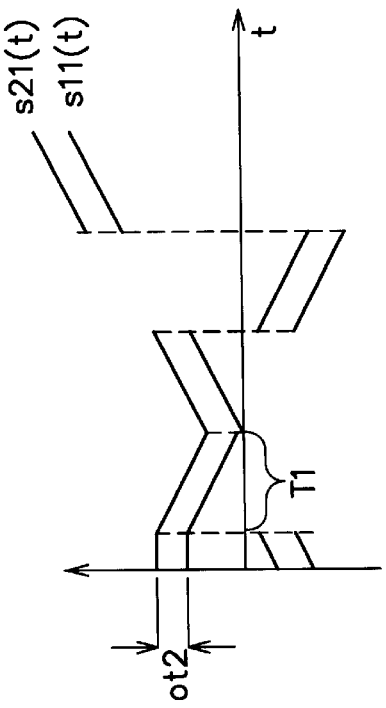

FIGS. 5A–5C are plots of the amplifier input and output signals as a function of time. Specifically, FIG. 5A illustrates the input signal s1(t) as a function of time, while FIG. 5B illustrates the signal s11(t) output from the first multiplier MUL1, and the signal s21(t) output from the amplifier, both as a function of time. Due to the multiplication by "1", the signal s21(t) coincides section by section with the input signal s1(t), and, due to the multiplication by "−1", in the other sections it mirrors the input signal s1(t) in the time axis. The amplifier OP amplifies its input signal s11(t) by an amplification factor v and adds an offset of amplitude ot2, resulting in the signal s21(t). In the interest of ease of illustration, an amplification factor of unity was selected for the purposes of FIGS. 5A–5C. However, one of ordinary skill will recognize that the amplification factor of unity provides no gain, and that in practice amplification factors typically exceed one-hundred (i.e., v=100).

After the phase shift of the signal s1(t) is reversed by an appropriate phase shift of the signal s21(t) by the multiplier MUL2, one obtains the output signal s2(t) illustrated in FIG. 5C, which appears as an amplified input signal vs1(t), on which a square-wave offset signal with an amplitude ot2 is superposed.

Figure 6:
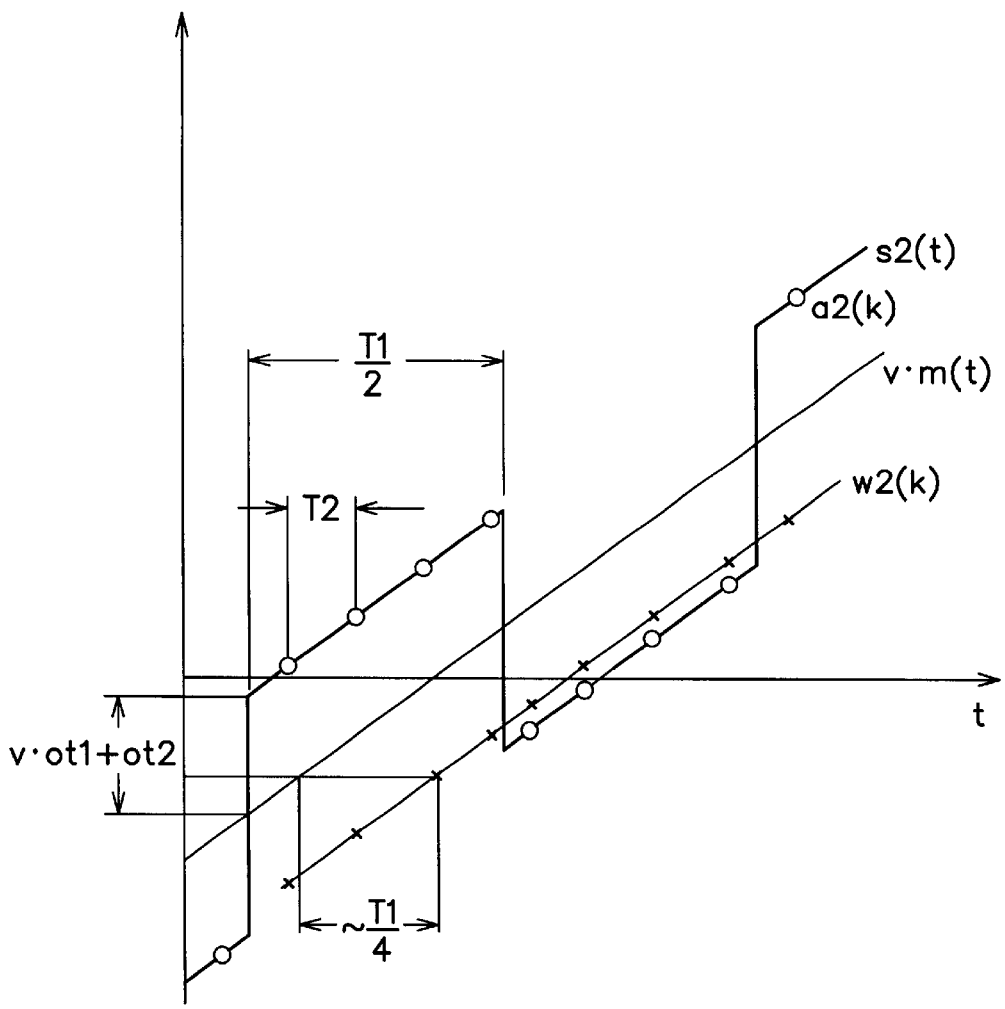
FIG. 6 is a plot of various system signals as a function of time.

If an output signal of the measurement device S is selected as the input signal s1(t) for the amplifier V, which consists of a measurement signal m(t) superposed with an offset signal of the first frequency f1 due to the chopping of the measurement device S, and if the phase of the signal s1(t) or s21(t) is shifted at the rate of the first frequency f1 and in-phase with the first offset signal, then the output signal s2(t) of the amplifier V will be the amplified measurement signal vm(t) with a superposed offset signal of frequency f1 and amplitude vot1+ot2, as illustrated in FIG. 6.

The remaining processing of this signal s2(t) corresponds to that of the unamplified signal s1(t) explained in connection with FIGS. 1 and 2. The signal s2(t) is sampled at the rate of the second frequency f2 to produce a sequence of sample values s2(k). The average is always formed of two sample values obtained over a half period T1/2 of the offset signal, to provide a sequence of measurement values w2(k) in synchronism with the sample frequency f2 that corresponds to measurement values of the measurement signal m(t), which are amplified by a factor v, where the values w2(k) being time-shifted relative to the actual measurement values approximately by T1/4.

If the amplifier is chopped with a third frequency, which is an even multiple of the first frequency f1, the subsequent sampling process and formation of an average likewise eliminates the second offset ot2, which was inserted by the amplification element OP. The chopping of the amplifier need not be in phase with the first offset signal.

Amplification elements, such as operational amplifiers, frequently have an inverting and a non-inverting input as well as an inverting and a non-inverting output. The chopping of the amplifier can be effected with such amplifiers by applying the input signal alternately to the inverting and non-inverting input, according to the specification of a clock pulse signal, and by tapping the output signal alternately from the inverting and non-inverting output, according to the specification of the same clock pulse signal.

Figure 7:
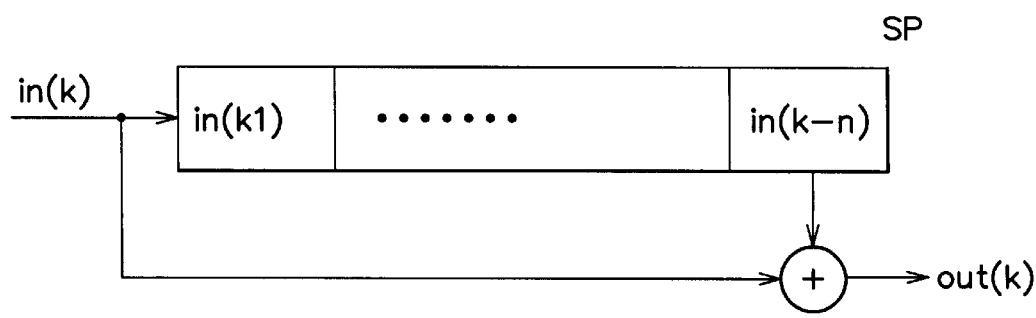
FIG. 7 is a functional block diagram of a device for averaging sequence signal values.

FIG. 7 is a functional block diagram of a device MW for averaging sequence signal values. The device includes a memory device SP, preferably a shift register, in which a number of sample values of the sample sequence a1(k), a2(k) can be stored. The number of memory cells preferably corresponds to the number n of sample values, which are created in the time interval T1/2, which lies between the sample values a1(k), a1(k−n); a2(k), a2(k−n), which were used to form an average. The device also includes an adder that adds the current sample value a1(k); a2(k) and the previously created and stored sample value a1(k−n); a2(k−n). The output signal of the adder is multiplied by the factor 1/2 to form a correct average. Since amplification of the measurement values is frequently desired in any case, this multiplication by 1/2 can also be omitted.

Although the present invention has been shown and described with respect to several preferred embodiments thereof, various changes, omissions and additions to the form and detail thereof, may be made therein, without departing from the spirit and scope of the invention.

What is claimed is:

1. A method of processing a summation signal s(t) from a sensor to recover sensed signal information within the bandwidth of the summation signal, wherein the summation signal s(t) includes a sensed signal m(t) and a first offset signal having a first frequency f1, the method comprising the steps of:

sampling the summation signal s(t) at a second frequency f2 that is a multiple of the first frequency f1, to create a sequence of sampled values; and averaging said sequence of sampled values to provide a sequence of averaged sampled values indicative of the sensed signal m(t).

2. The method of claim 1, comprising the step of amplifying said summation signal s(t) prior to said steps of sampling and averaging.

3. The method of claim 1, wherein said step of averaging includes summing two signals within said sequence of sampled values during a half period (T1/2) of the offset signal or an odd multiple of the value T1/2, wherein T1 is the period of the offset signal.

4. The method of claim 2, wherein said step of amplifying includes:

shifting the phase of said summation signal s(t) by 180 degrees at periodic time intervals given by a third frequency value, and providing a signal s11(t) indicative thereof;

amplifying said signal s11(t) by an amplification factor, and providing an amplified signal s21(t) indicative thereof; and shifting the phase of said amplified signal s21(t) by 180 degrees at periodic time intervals given by said third frequency.

5. The method of claim 4, wherein said third frequency value is identical to said first frequency value f1 or an even multiple thereof.

6. The method of claim 5, wherein the phase shift of said summation signal s1(t) occurs in phase with said first offset signal.

7. A system for processing a signal s(t) from a sensor to recover sensed signal information within the bandwidth of the summation signal, wherein the signal s(t) includes a sensed signal m(t) and a first offset signal having a first frequency f1, said system comprising:

means for sampling the signal s(t) at a second frequency rate f2 that is a multiple of the first frequency f1, to create a sequence of sampled values; and means for averaging said sequence of sampled values to provide a sequence of averaged sampled values indicative of the sensed signal m(t).

8. The system of claim 7, wherein said means for sampling comprises an amplifier that amplifies said summation signal s(t) prior to sampling.

9. The system of claim 8, wherein said amplifier comprises:

means for shifting the phase of said summation signal s(t) by 180 degrees at periodic time intervals given by a third frequency value, and providing a signal s11(t) indicative thereof;

means for amplifying said signal s11(t) by an amplification factor, and providing an amplified signal s21(t) indicative thereof; and means for shifting the phase of said amplified signal s21(t) by 180 degrees at periodic time intervals given by said third frequency to provide a signal indicative of said sampled values.

* * * * *

UNITED STATES PATENT AND TRADEMARK OFFICE
CERTIFICATE OF CORRECTION

PATENT NO. : 6,320,430 B1
DATED : November 20, 2001
INVENTOR(S) : Lothar Blossfeld It is certified that error appears in the above-identified patent and that said Letters Patent is hereby corrected as shown below:

<u>Column 3,</u>
Line 65, delete "had" and insert -- and --.

Signed and Sealed this

Seventh Day of May, 2002

*Attest:*

*Attesting Officer*

JAMES E. ROGAN
*Director of the United States Patent and Trademark Office*